(12) United States Patent
Cai et al.

(10) Patent No.: US 10,020,247 B2
(45) Date of Patent: Jul. 10, 2018

(54) METHOD AND SYSTEM FOR IMPROVED MATCHING FOR ON-CHIP CAPACITORS

(71) Applicant: Maxlinear, Inc., Carlsbad, CA (US)

(72) Inventors: Weizhong Cai, Carlsbad, CA (US); Kimihiko Imura, Carlsbad, CA (US); Wei Gu, Carlsbad, CA (US)

(73) Assignee: Maxlinear, Inc., Carlsbad, CA (US)

( * ) Notice: Subject to any disclaimer, the term of this patent is extended or adjusted under 35 U.S.C. 154(b) by 0 days.

(21) Appl. No.: 14/950,865

(22) Filed: Nov. 24, 2015

(65) Prior Publication Data

US 2017/0148712 A1    May 25, 2017

Related U.S. Application Data

(63) Continuation of application No. 13/917,147, filed on Jun. 13, 2013, now Pat. No. 9,209,238.

(60) Provisional application No. 61/661,611, filed on Jun. 19, 2012.

(51) Int. Cl.
*H01L 23/495* (2006.01)
*H01L 21/48* (2006.01)

(52) U.S. Cl.
CPC .... *H01L 23/49589* (2013.01); *H01L 21/4825* (2013.01); *H01L 23/4951* (2013.01); *H01L 23/49551* (2013.01); *H01L 23/49575* (2013.01)

(58) Field of Classification Search
CPC ........................................................ H01L 28/40
USPC ........................................ 257/532; 361/303
See application file for complete search history.

(56) References Cited

U.S. PATENT DOCUMENTS

2009/0091875 A1\* 4/2009 Yeh ........................ H01G 4/33
361/303

\* cited by examiner

*Primary Examiner* — Moazzam Hossain
*Assistant Examiner* — Warren H Kilpatrick
(74) *Attorney, Agent, or Firm* — McAndrews, Held & Malloy

(57) ABSTRACT

Methods and systems for improved matching for on-chip capacitors may comprise in a semiconductor die comprising an on-chip capacitor with one or more metal layers: electrically coupling a first set of metal fingers, electrically coupling a second set of metal fingers that are interdigitated with the first set of metal fingers, wherein the first set of metal fingers and the second set of metal fingers are arranged symmetrically in the semiconductor die, and configuring the on-chip capacitor in a plurality of symmetric sections, wherein a boundary between each of the plurality of sections is configured in a zig-zag pattern. The first set of metal fingers and the second set of metal fingers may be arranged with radial symmetry. A first set of metal fingers in a first metal layer may be electrically coupled to a set of metal fingers in a second metal layer.

21 Claims, 10 Drawing Sheets

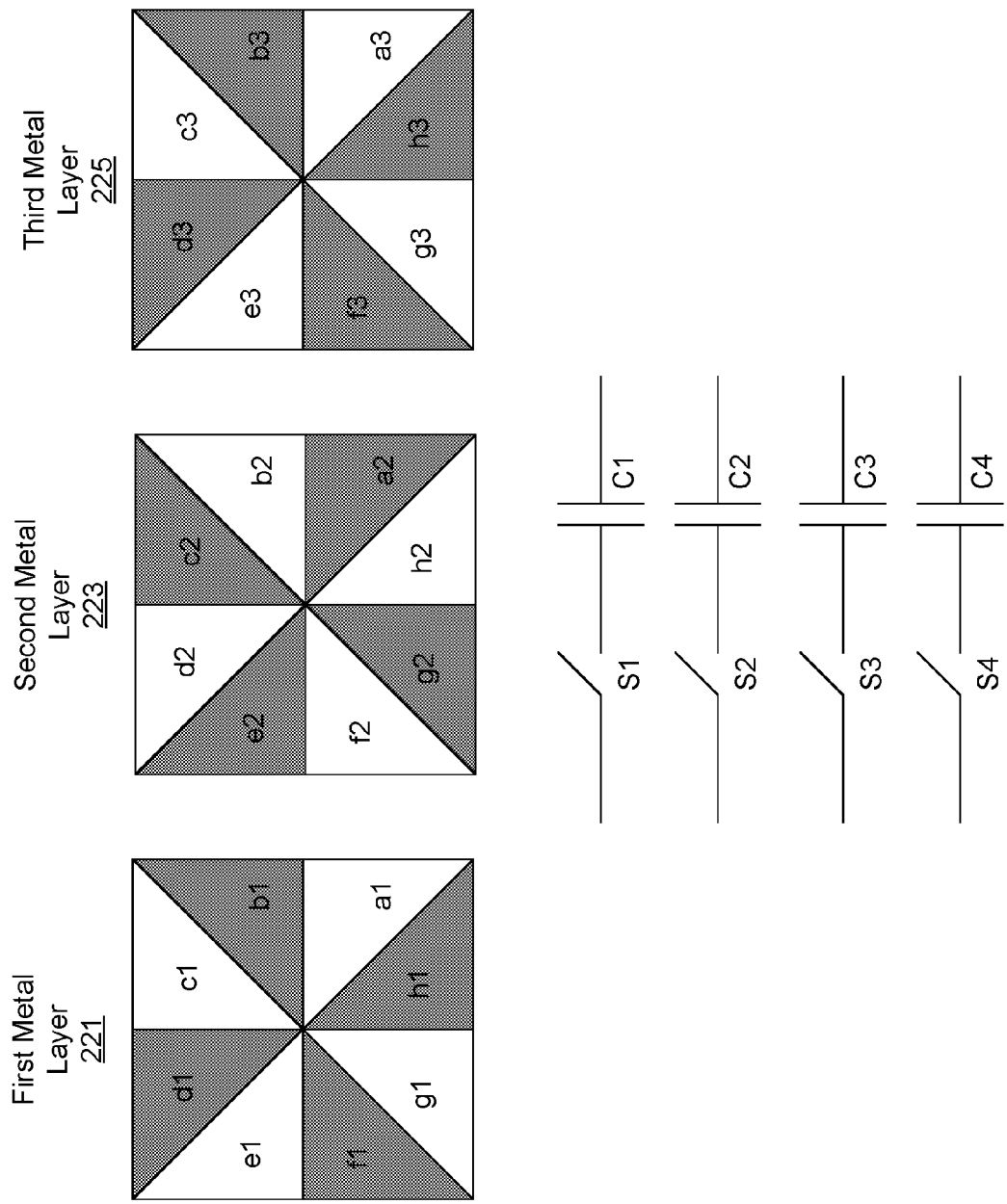

METHOD AND SYSTEM FOR IMPROVED MATCHING FOR ON-CHIP CAPACITORS

CROSS-REFERENCE TO RELATED APPLICATIONS/INCORPORATION BY REFERENCE

This application is a continuation of application Ser. No. 13/917,147 filed on Jun. 13, 2013, which makes reference to and claims priority to U.S. Provisional Application Ser. No. 61/661,611 filed on Jun. 19, 2012. Each of the above stated applications is hereby incorporated herein by reference in its entirety.

FIELD OF THE INVENTION

Certain embodiments of the invention relate to semiconductor devices. More specifically, certain embodiments of the invention relate to a method and system for improved matching for on-chip capacitors.

BACKGROUND OF THE INVENTION

Complementary metal oxide semiconductor (CMOS) transistors are ubiquitous in today's electronics devices. As more devices are being integrated onto CMOS chips, capacitors have moved from being board-mounted discrete devices to being integrated on the chip. However, higher capacitances require large areas and suffer from mismatch issues due to process variations.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for improved matching for on-chip capacitors, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 2B is a diagram illustrating the rotational symmetry of radial sections of an on-chip capacitor, in accordance with an embodiment of the invention.

DETAILED DESCRIPTION OF THE INVENTION

Certain aspects of the invention may be found in a method and system for improved matching of on-chip capacitors. Exemplary aspects of the invention may comprise a semiconductor die comprising an on-chip capacitor comprising one or more metal layers. The on-chip capacitor may comprise a first set of electrically coupled metal fingers and a second set of electrically coupled metal fingers that are interdigitated with the first electrically coupled set of metal fingers. The first set of electrically coupled metal fingers and the second set of electrically coupled metal fingers may be arranged symmetrically in the semiconductor die to compensate for non-uniformities in the one or more metal layers. The electrically coupled first set of metal fingers and the electrically coupled second set of metal fingers may be arranged with radial symmetry. A first set of metal fingers in a first metal layer may be electrically coupled to a set of metal fingers in a second metal layer. An orientation of metal fingers may be alternated when coupling sets of metal fingers in a plurality of metal layers. The orientation of the metal fingers may be alternated between clockwise and counter-clockwise directions. The first set of metal fingers may be coupled at the center of the on-chip capacitor and the second set of metal fingers may be coupled at the outer edge of the on-chip capacitor. The first set of metal fingers may be coupled at the outer edge of the on-chip capacitor and the second set of metal fingers may be coupled at the center of the on-chip capacitor. The electrically coupled first set of metal fingers and the electrically coupled second set of metal fingers may be configured in a fan-like orientation. The on-chip capacitor may be configured in a plurality of symmetric sections wherein a boundary between each of the plurality of sections is configured in a zig-zag pattern.

As utilized herein, "and/or" means any one or more of the items in the list joined by "and/or". As an example, "x and/or y" means any element of the three-element set $\{(x), (y), (x, y)\}$. As another example, "x, y, and/or z" means any element of the seven-element set $\{(x), (y), (z), (x, y), (x, z), (y, z), (x, y, z)\}$. As utilized herein, the terms "block" and "module" refer to functions than can be implemented in hardware, software, firmware, or any combination of one or more thereof. As utilized herein, the term "exemplary" means serving as a non-limiting example, instance, or illustration. As utilized herein, the term "e.g.," introduces a list of one or more non-limiting examples, instances, or illustrations.

Figure 1:
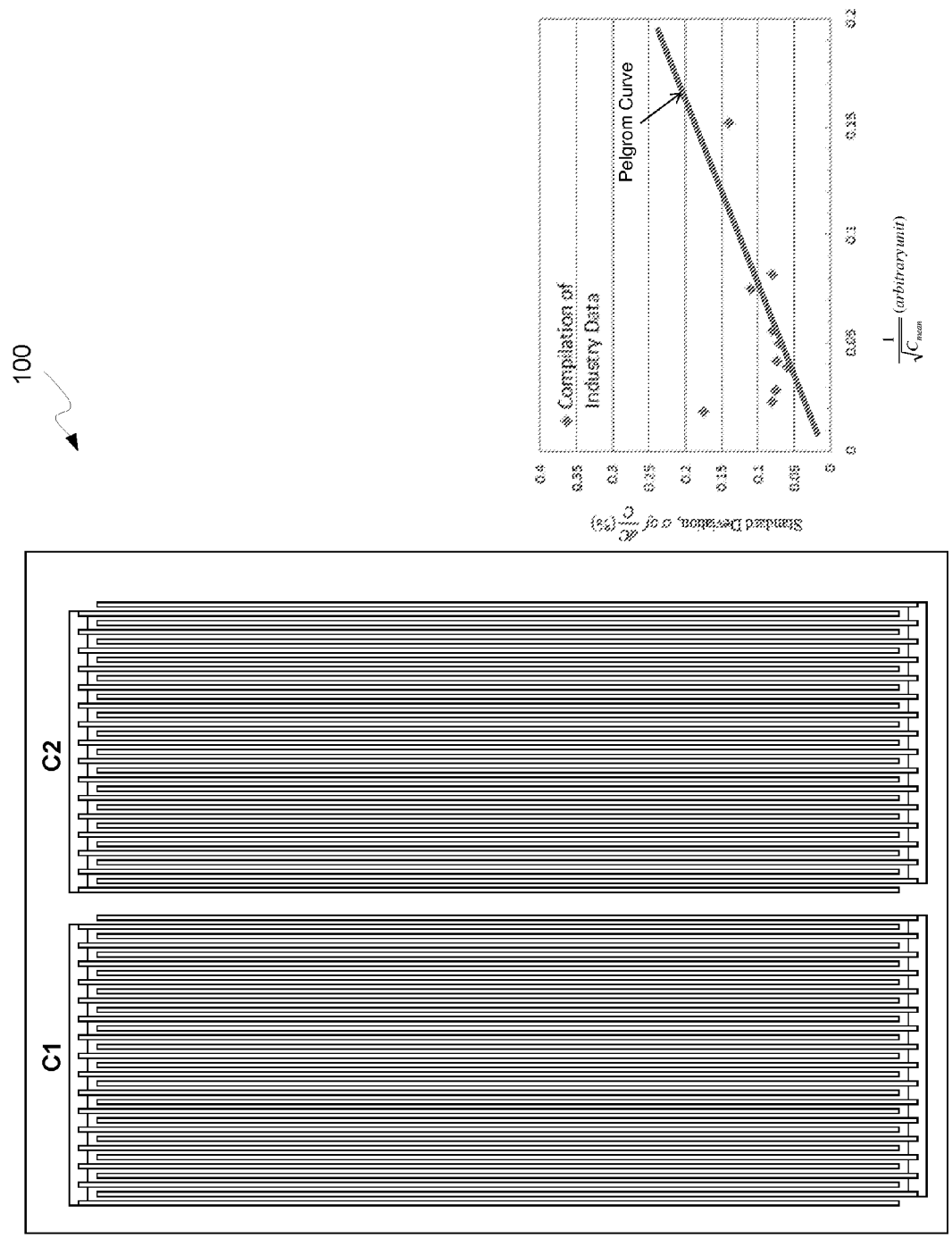
FIG. 1 is a diagram of an exemplary on-chip capacitor, in connection with an embodiment of the invention.

FIG. 1 is a diagram illustrating an exemplary on-chip capacitor, in connection with an embodiment of the invention. Referring to FIG. 1, there is shown an on-chip capacitor circuit 100 comprising capacitors C1 and C2. The conventional architecture shown with capacitor elements comprising interdigitated fingers situated side-by-side requires a large area of the die, which also leads to excessive mismatch due to wafer processing variations over such large areas. These process variations may result in different spacing between the interdigitated fingers, different thicknesses, or different dielectric constants in the materials adjacent to the fingers, for example.

Typical complementary metal oxide semiconductor (CMOS) processing technology renders metal-oxide-metal (MOM) capacitors subject to cross-wafer processing gradients. The plot to the right of the on-chip capacitor circuit 100 shows measured mismatch data on the y-axis with inverse capacitance on the x-axis, where low numbers on the x-axis indicate larger capacitance values. The data deviates from the classical Pelgrom curve, and indicates a larger deviation from expected values at higher capacitance values, i.e. larger areas.

Figure 2A:
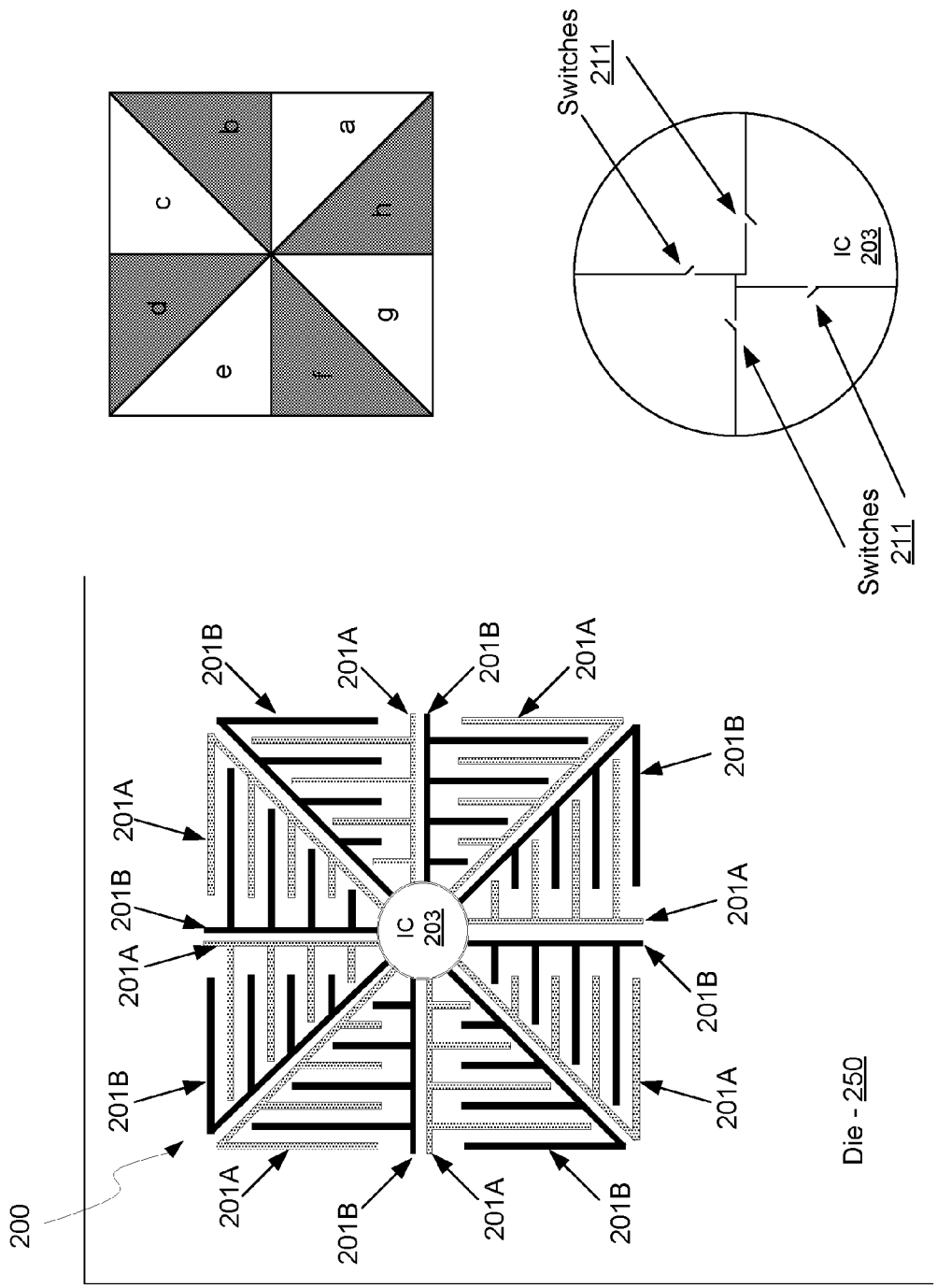
FIG. 2A is a diagram illustrating an exemplary two-terminal radially symmetric capacitor structure, in accordance with an embodiment of the invention.

FIG. 2A is a diagram illustrating an exemplary two-terminal radially symmetric capacitor structure, in accordance with an embodiment of the invention. Referring to FIG. 2A, there is shown an on-chip capacitor 200 comprising eight sections of interdigitated metal fingers, labeled as a-h in the simplified schematic to the right in FIG. 2A, integrated on a semiconductor die or chip, the die 250. The on-chip capacitor 200 may comprise multiple metal layers, or stacks, where in each layer, the metal fingers 201A and 201B are separated into the eight sections. There is also shown an interconnect 203 where the metal fingers may be coupled to configure one or more capacitor structures.

In an example scenario, the lighter shaded metal fingers 201A in sections a through h may be coupled in the interconnect 203, while the black metal fingers 201B in these sections may be coupled by connecting to a different metal layer using via holes. In this scenario, a single capacitor results with black and lighter shaded metals as its two terminals. The sections b, d, f, h are shaded to indicate that the 45-degree arms of these sections are connected through vias. In comparison, sections a, c, e, g are not shaded because their 45-degree arms are connected through IC 203.

In this manner, a configurable number of capacitor elements may be orientated in a radially symmetric structure as well as being symmetric in the vertical direction, thereby sharing, and thus canceling out, any process variations in both horizontal and vertical planes. The structure shown in FIG. 2A may illustrate an "electric fan-like" rotational symmetry, which comprises eight 45-degree segments consisting of interdigitated fingers with lengths varying from roughly zero to half the total width of the section.

The interconnect 203 is shown with further detail in the lower right corner of FIG. 2A, which illustrates an example interconnection for one set of the metal fingers, the black metal fingers 201B that are in the non-shaded regions a, c, e, and g. In an example scenario, the interconnect 203 may comprise switches 211 that enable the metal fingers to be coupled when desired, such as for a switched capacitor or a configurable capacitor, for example. The switches may comprises CMOS transistors, for example, integrated on the same chip as the on-chip capacitor 200 or switches external to the chip.

While FIG. 2A illustrates a two-terminal capacitor, the on-chip capacitor 200 may be configured in a three-terminal, or more, device depending on how the sections are coupled. The on-chip capacitor 200 comprises eight 45-degree sections, but the invention is not so limited. Any number of sections and metal layers may be utilized depending on processing requirements or limitations.

The on-chip capacitor 200 may exhibit circular symmetry both in a given metal layer and vertically between different metals for minimizing and/or eliminating the capacitance mismatch. Interconnecting vias may be placed along the 45 degree cut lines between the sections for minimizing series resistance. The interconnection schemes that may be utilized between the different sections of a given metal layer, as well as between different levels, provides the flexibility of routing the entire device into one, two, or four intertwined capacitors, for example.

Figure 4:
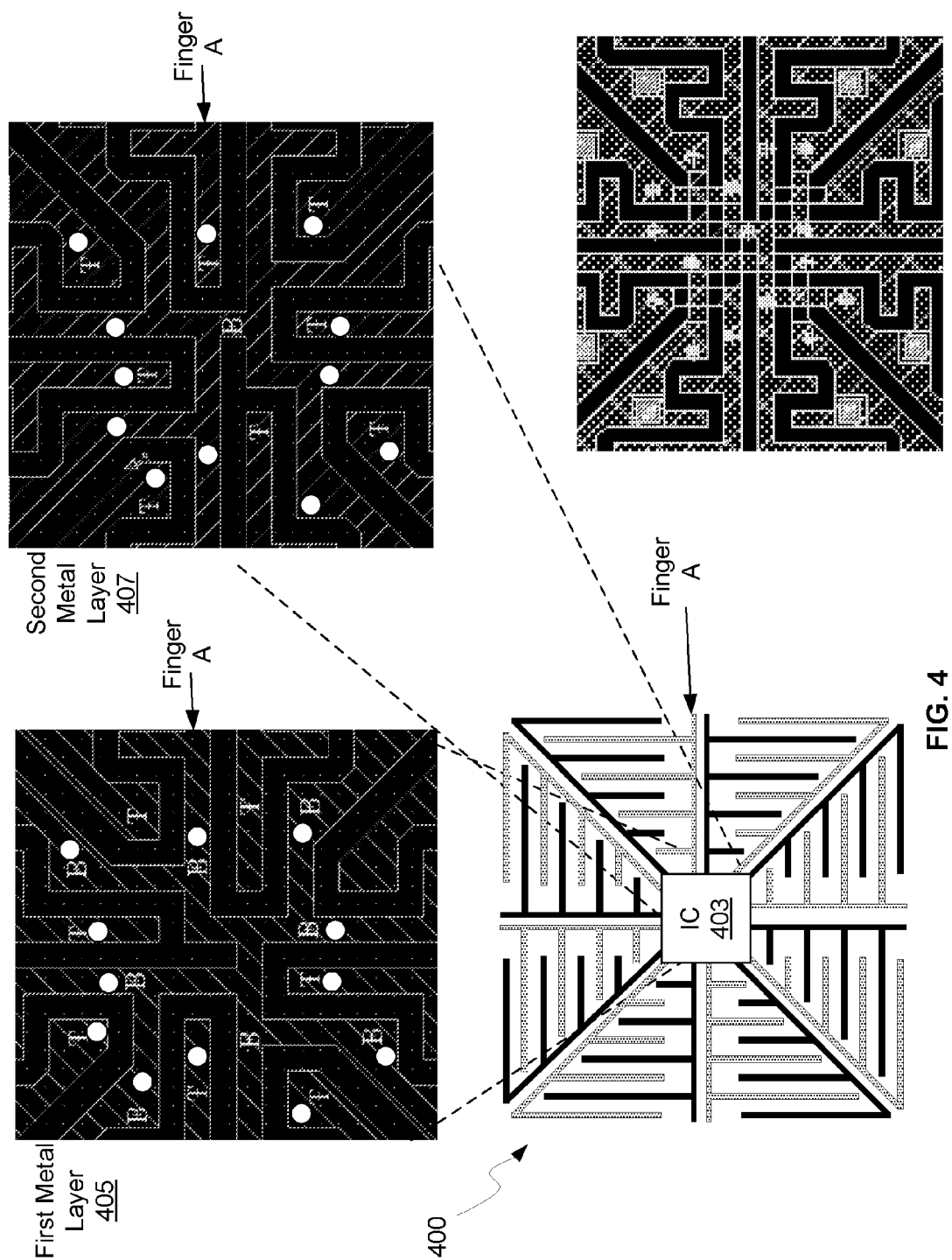
FIG. 4 is a diagram illustrating the interconnection of radial sections of an on-chip capacitor, in accordance with an embodiment of the invention.
Figure 5:
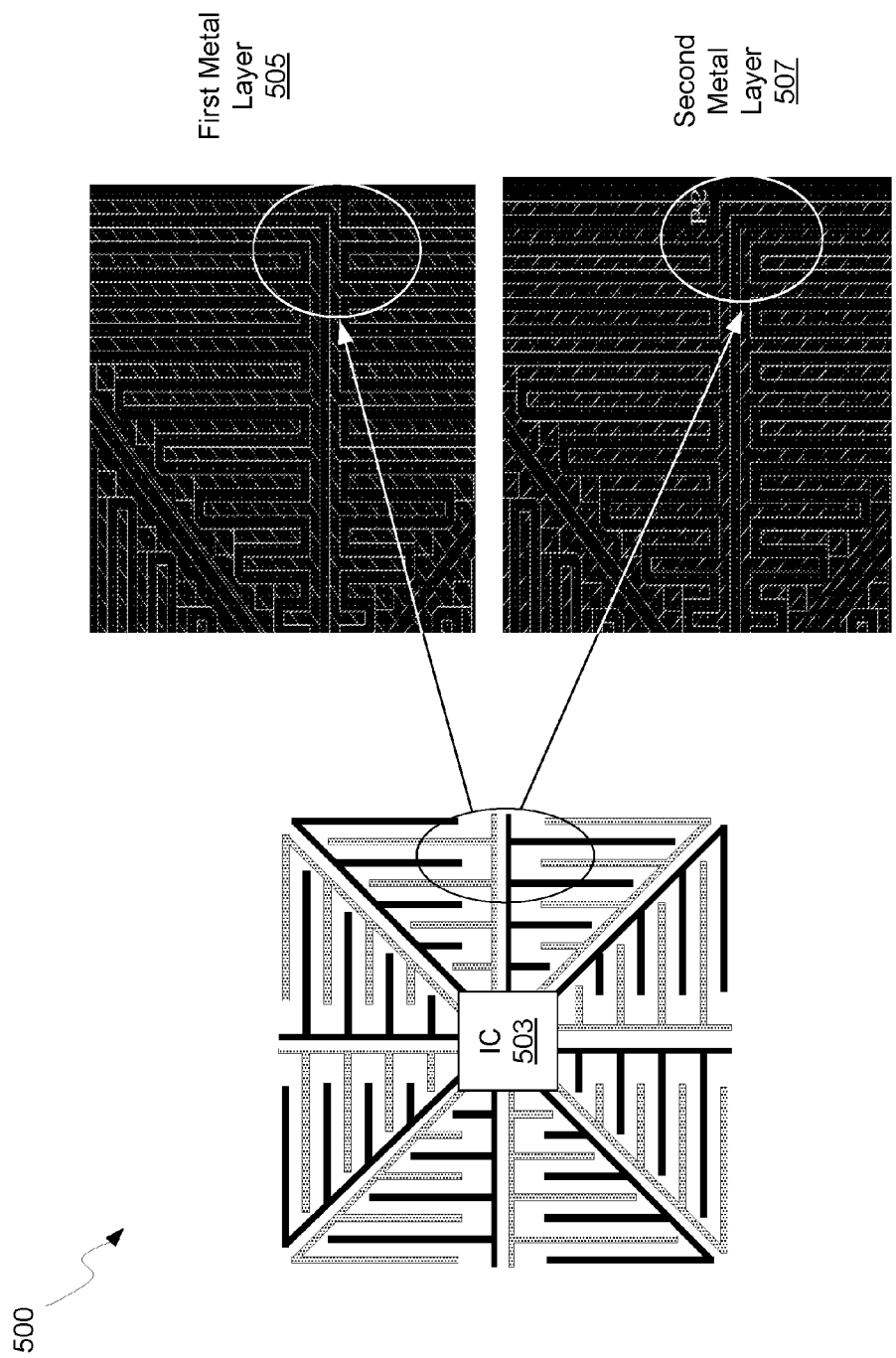
FIG. 5 is a diagram illustrating the edge interconnection of radial sections of an on-chip capacitor, in accordance with an embodiment of the invention.

The separate sections and the separate layers may be coupled in the center and/or outside edge, as shown further with respect to FIGS. 4 and 5. For example, one half of the fingers of each section may be coupled together while the fingers in the other half of each section may be coupled together, resulting in a radially symmetric capacitor element, with any process variations across the wafer shared by each capacitor, thereby reducing and/or eliminating any mismatch between the capacitor elements.

The on-chip capacitor 200 may comprise a plurality of metal layers with similarly configured interdigitated fingers, but with alternating interconnections, thereby generating capacitors in the vertical direction as well as horizontal. Vias may be utilized to create interconnects between metal layers.

FIG. 2B is a diagram illustrating the rotational symmetry of radial sections of an on-chip capacitor, in accordance with an embodiment of the invention. Referring to FIG. 2B, there is shown a series of interconnection schemes for different metal layers, the first metal layer 221, the second metal layer 223, and the third metal layer 225. In each of the metal layers 221, 223, and 225, the lighter shaded sections may be coupled together in the center interconnect, as described with respect to FIG. 2A. Similarly, the darker shaded regions may comprise sections coupled at the outer edge.

Capacitance variations across a die or wafer may be minimized and/or eliminated by alternating the coupled regions for each capacitor section in each metal layer, such that non-uniformities in the wafer comprising the capacitor or capacitors may be shared, and thus cancelled out, among the sections.

The structure shown in FIG. 2B may illustrate an "electric fan-like" rotational symmetry, which comprises eight 45-degree segments consisting of interdigitated fingers with lengths varying from roughly zero to half the total width of the section, by alternating the interconnected regions.

In an example scenario, the fan-like structure of FIG. 2B may be utilized to construct four capacitors with equal capacitance. This is illustrated by the following four equations:

$$CAP\_1 = a_1 + c_1 + a_2 + c_2 + a_3 + c_3$$

$$CAP\_2 = b_1 + d_1 + b_2 + d_2 + b_3 + d_3$$

$$CAP\_3 = e_1 + g_1 + e_2 + g_2 + e3 + g_3$$

$$CAP\_4 = f_1 + h_1 + f_2 + h_2 + f_3 + h_3$$

For example, the first capacitor, CAP_1, is configured by coupling the $a_1$ and $c_1$ regions in each of the first, second, and third metal layers 221, 223, and 225, and the remaining capacitors may be similarly configured using the b/d, e/g, and f/h regions of the metal layers. However, the invention is not so limited, as any arrangement desired may be utilized depending on wafer processing asymmetry or interconnection placement, for example.

This flexibility in device partitioning may benefit the design of circuits that require a multitude of near-identical capacitors $C_i$, where i=1, . . . , N, with each controlled by a switch, as shown by the switches S1-S4 coupled to the capacitors C1-C4 in FIG. 2B.

Figure 3:
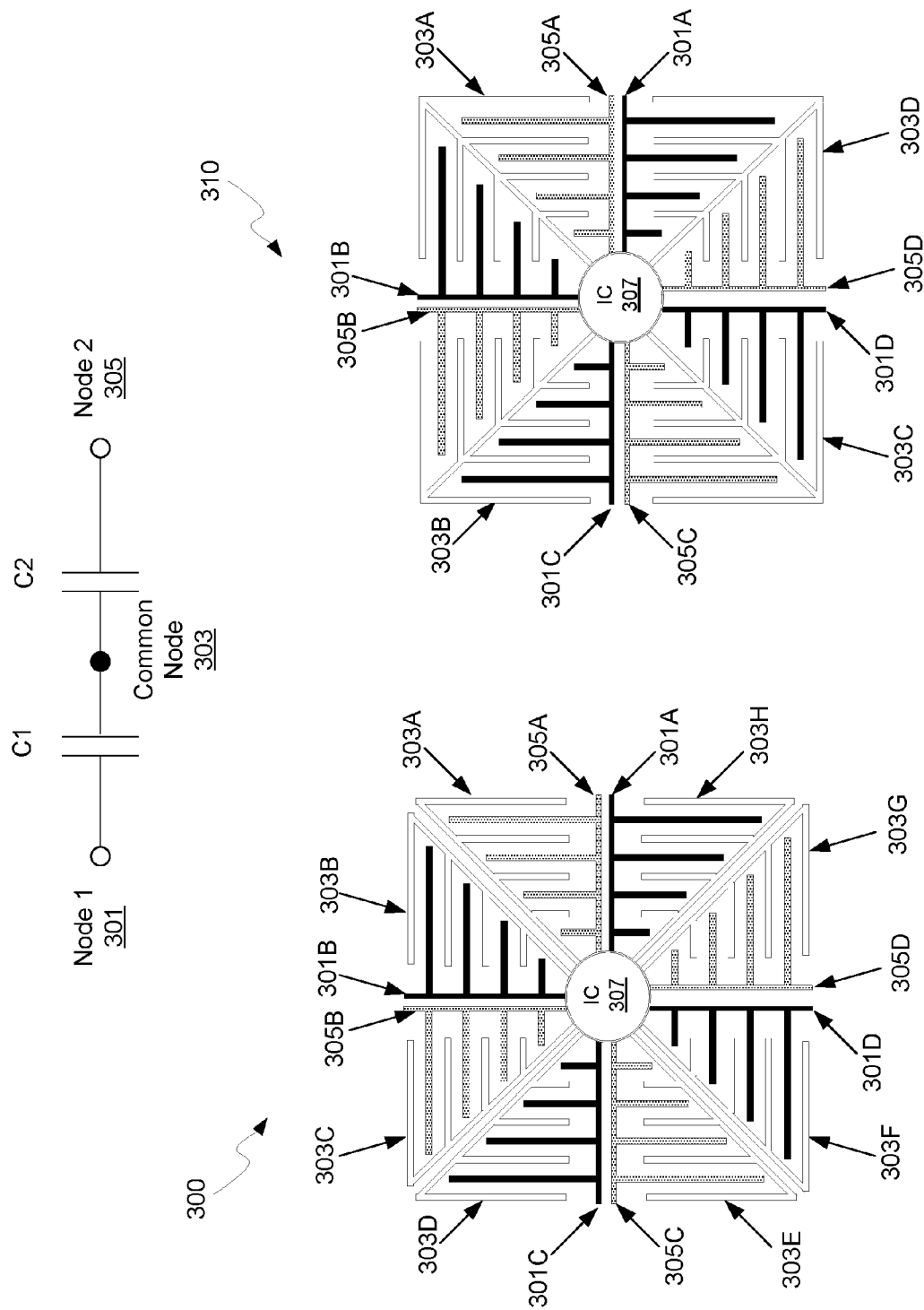
FIG. 3 is a diagram illustrating exemplary symmetric fan-shaped on-chip capacitors with rotational symmetry, in accordance with an embodiment of the invention.

FIG. 3 is a diagram illustrating exemplary symmetric fan-shaped on-chip capacitors with rotational symmetry, in accordance with an embodiment of the invention. Referring to FIG. 3, there is shown radially symmetric on-chip capacitors 300 and 310. The on-chip capacitors 300 and 310 may comprise a plurality of metal levels organized in radially symmetric sections of interdigitated metal fingers. Each of the on-chip capacitors 300 and 310 may comprise two equal capacitance value capacitors.

Two example embodiments for intertwined capacitors, C1 and C2, with nearly identical capacitance values are shown in FIG. 3. FIG. 3 shows three different shadings to indicate three different terminals. Referring to the on chip capacitors 300, the black metal fingers 301A-301D may be coupled by connecting to a different metal layer using via holes and thus comprise node 1 301 of the capacitor C1. In addition, the common node 303 may comprise the white colored metal fingers 303A-303H, and together with node 1 301, comprise the capacitor C2 with radial symmetry.

Similarly, the lighter shaded metal fingers 305A-305D in these sections comprise the node 2 305 of capacitor C2. In contrast to the on-chip capacitor shown in FIG. 2, the 45-degree arms belong to the same net, hence the white colored fingers. Because of the nature of segmentation, the values of C1 and C2 are identical.

In still another example scenario, the neighboring 45-degree arms may be merged into a single white colored metal, the metal fingers 303A-303D shown for the on-chip capacitors 310, which increase the capacitance value for a given device footprint since less area is needed for the common node 303. As in FIG. 2, the metal fingers in the on-chip capacitors 300 and 310 may be coupled in the interconnect 307.

FIG. 4 is a diagram illustrating the interconnection of radial sections of an on-chip capacitor, in accordance with an embodiment of the invention. Referring to FIG. 4, there is shown an on-chip capacitor 400 with eight sections oriented around the interconnect 403. The interconnect 403 at the center of the structure is shown in close-up views in the upper two images of FIG. 4. The upper left figure shows the metal finger interconnection scheme in the first metal layer 405 and the upper right figure shows the metal finger interconnection scheme in the second metal layer 407. The metal layers are indicated by the diagonal-lined areas and the letters T and B in the images represent top and bottom terminals of a capacitor.

In an exemplary scenario, the connections in the metal layers 405 and 407 may be reversed, in that the T and B interconnects may be reversed in alternating layers. For example, one half of the fingers in one of the eight sections may be a T terminal in one metal layer and may be a B terminal in the next metal layer. This may provide further flexibility in capacitor architecture and mitigation of mismatch due to non-uniformity across a wafer.

The interconnect 403 may comprise connecting paths between metal fingers in a layer and may also comprise connecting paths in a vertical direction, as indicated by the white dots in the upper figures. In this manner, fingers in the first metal layer 405 may be electrically coupled to fingers in the second metal layer 407. In an example scenario, fingers that are a top terminal of a capacitor in the first metal layer 405 may be coupled to a similarly located metal fingers that are a bottom terminal in the second metal layer 407. For example, the "Finger A" labeled in the lower figure may be a bottom terminal in the first metal layer 405, as indicated by the "B" by the "Finger A" in the upper left figure, and may be a top terminal in the second metal layer 407, as indicated by the "T" by the "Finger A" in the upper right figure.

The placement of interconnections in a given plane as well as interconnections between planes gives significant flexibility in the configuration of the number and size of capacitors possible. Furthermore, due to the symmetry of the structures about the central axis, non-uniformities across a wafer are shared and greatly and/or eliminates capacitance non-uniformity.

FIG. 5 is a diagram illustrating the edge interconnection of radial sections of an on-chip capacitor, in accordance with an embodiment of the invention. Referring to FIG. 5, there is shown an on-chip capacitor 500 with close-up views to the right showing the edge connection of the sections of the on-chip capacitor 500. There is also shown an interconnect 503, which may be substantially similar to the interconnect 403 described with respect to FIG. 4.

The upper image may comprise a first metal layer 505 and the lower image may comprise a second metal layer 507. The first and second metal layers 505 and 507 comprise the diagonal-lined areas of the figures, and illustrate that metal fingers from different sections may be coupled at the outer edges of the capacitor 500. It should be noted that the number of metal fingers shown in the simplified drawing to the left is less than the figures to the right, to simplify the figure. As with the center interconnection example shown in FIG. 4, the edge connections may be reversed between metal layers, in that the T and B terminals may alternate between metal layers. In addition, interconnects may be integrated vertically between layers, electrically coupling desired traces in the first and second metal layers 505 and 507, as well as other metal layers. Accordingly, the on-chip capacitor 500 is not limited to two metal layers and eight sections of metal fingers.

Figure 6:
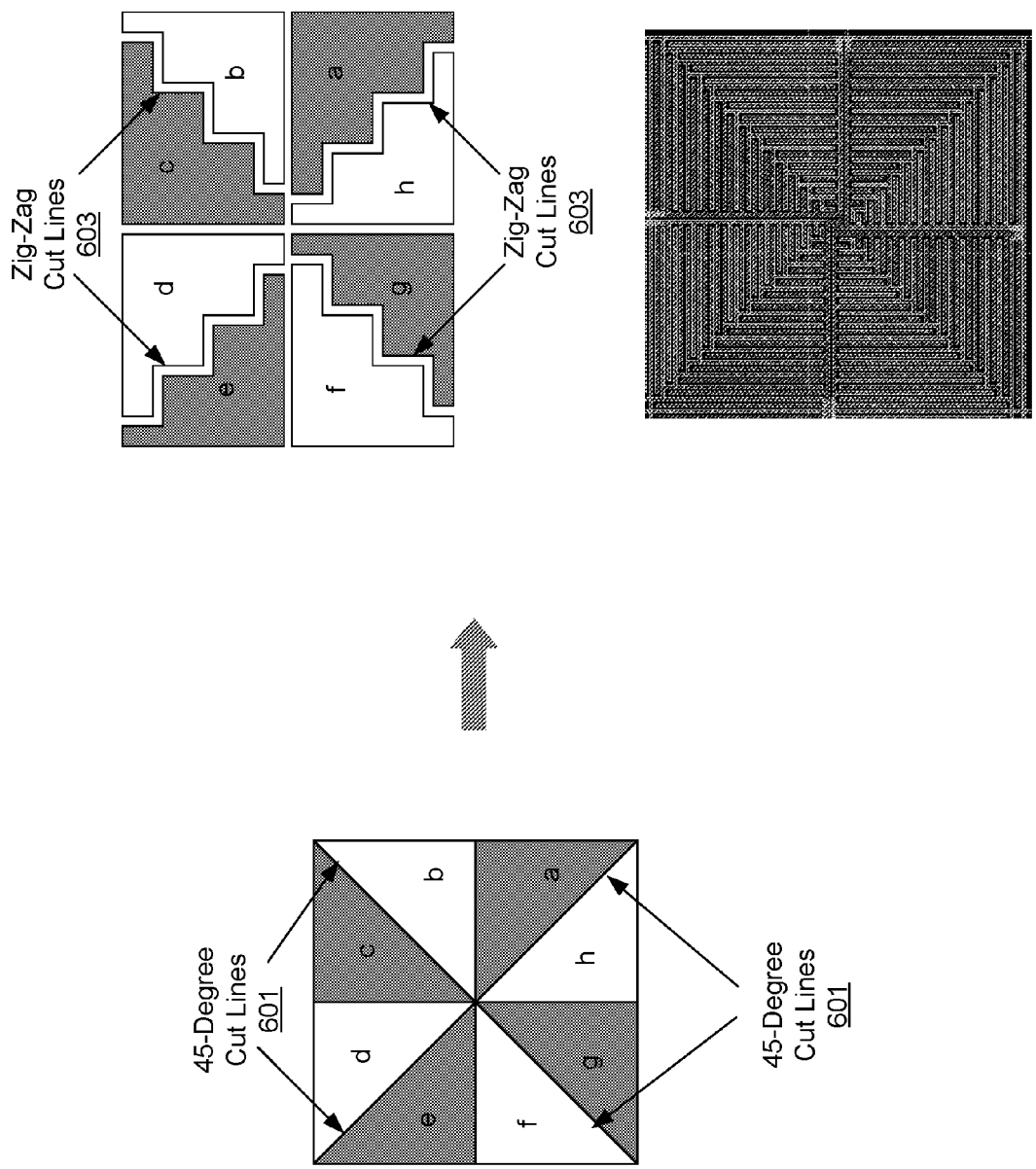
FIG. 6 is an alternative cut-line for radial sections in an on-chip capacitor, in accordance with an embodiment of the invention.

FIG. 6 is an alternative cut-line for radial sections in an on-chip capacitor, in accordance with an embodiment of the invention. Referring to FIG. 6, there is shown an eight-section radially symmetric capacitor structure with an alternative embodiment shown on the right, where the 45-degree cut-lines 601 of the left figure are replaced with zig-zag cut-line 603 shown in the right figure. This may be useful in instances where diagonal lines are difficult or undesired in the semiconductor process. The micrograph in the lower right corner of FIG. 6 illustrates an on-chip capacitor with zig-zag cut lines.

Figure 7:
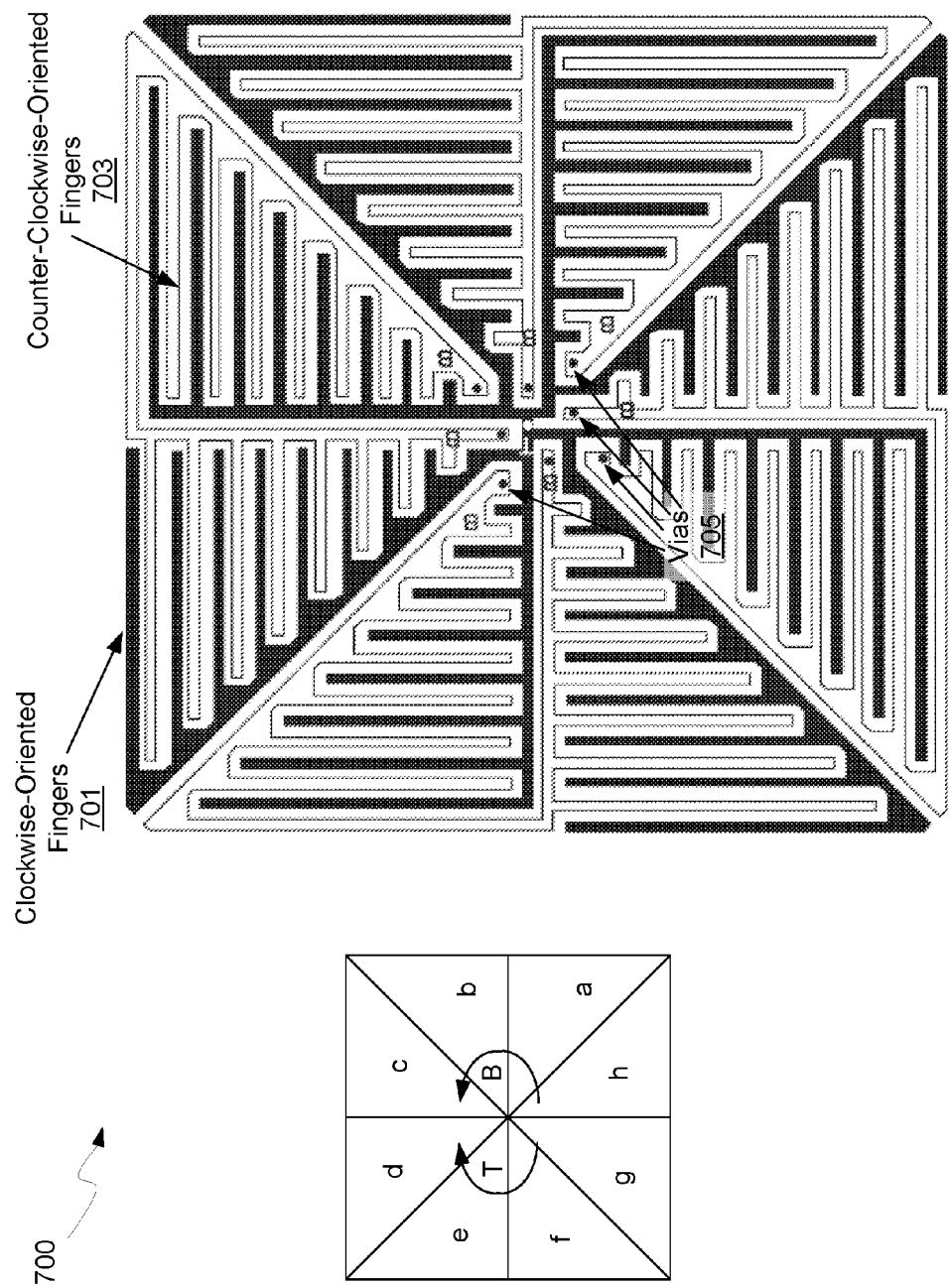
FIG. 7 is a diagram illustrating radially symmetric capacitor section interconnection, in accordance with an embodiment of the invention.

FIG. 7 is a diagram illustrating radially symmetric capacitor section interconnection, in accordance with an embodiment of the invention. Referring to FIG. 7, there is shown a first metal layer 700 of an on-chip capacitor and associated simplified schematic to the left. The T terminal, comprising the clockwise-oriented fingers metal fingers 701, illustrates that the fingers that face in a clockwise direction around the on-chip capacitor 700 are interconnected at the center of the on-chip capacitor.

In contrast, the B terminal connections, the counter-clockwise-oriented fingers 703, shown as the shaded metal fingers, are coupled at the outer edges of the on-chip capacitor. Furthermore, both the clockwise oriented fingers 701 and the counter-clockwise-oriented fingers 703 may be coupled by vias to metal fingers in other metal layers of the on-chip capacitor, such as the metal layers described with respect to FIG. 8. The vias are indicated by the dots near the center of the structure.

Figure 8:
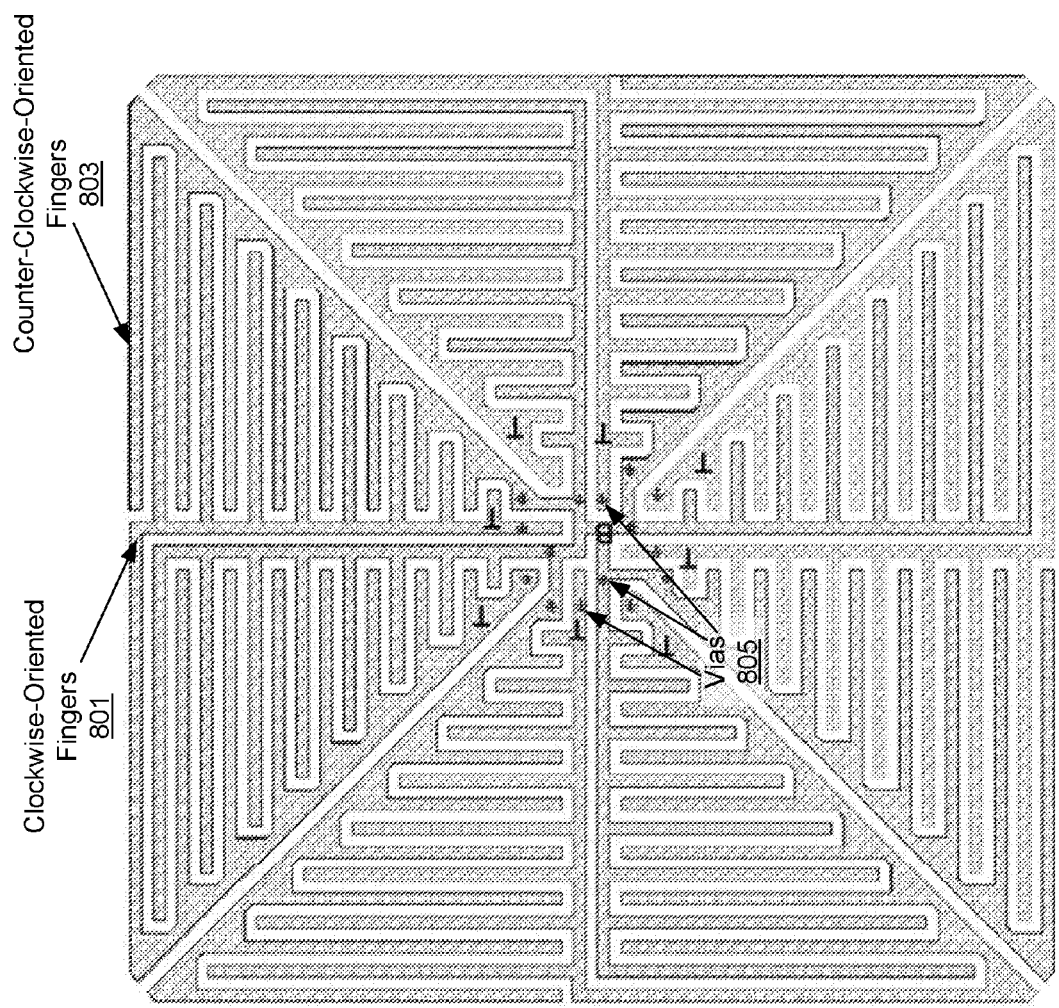
FIG. 8 is a diagram illustrating a second metal layer radially symmetric capacitor section interconnection, in accordance with an embodiment of the invention.
Figure 8:
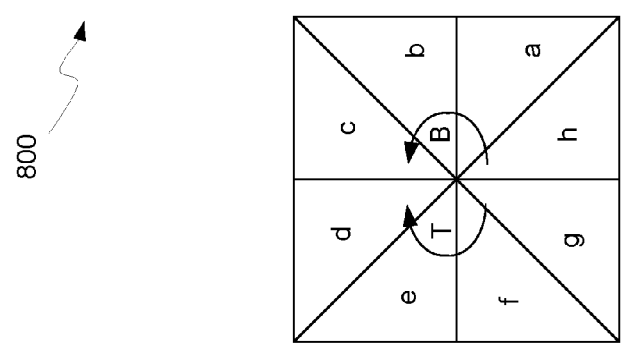

FIG. 8 is a diagram illustrating a second metal layer radially symmetric capacitor section interconnection, in accordance with an embodiment of the invention. Referring to FIG. 8, there is shown the second metal layer 800 of an on-chip capacitor and associated simplified schematic to the left indicating the direction in which the metal fingers are pointing. In this layer, the B terminal is again oriented in a counter-clockwise direction, but in this layer, the counter-clockwise-oriented fingers 803 are connected at the center of the layer.

The T terminal connections are again oriented in a clockwise direction, but in this layer, the clockwise-oriented fingers 801 are coupled at the outer edge of the layer. Both the clockwise-oriented fingers 801 and the counter-clockwise-orientated fingers 803 may be coupled to other metal layers by the vias 805, which are indicated by the characters near the center of the structure. In this manner, center-connected and outer edge-connected terminals may alternate between layers, thereby providing further flexibility in mitigating and/or eliminating capacitance variations in on-chip capacitors.

Figure 9:
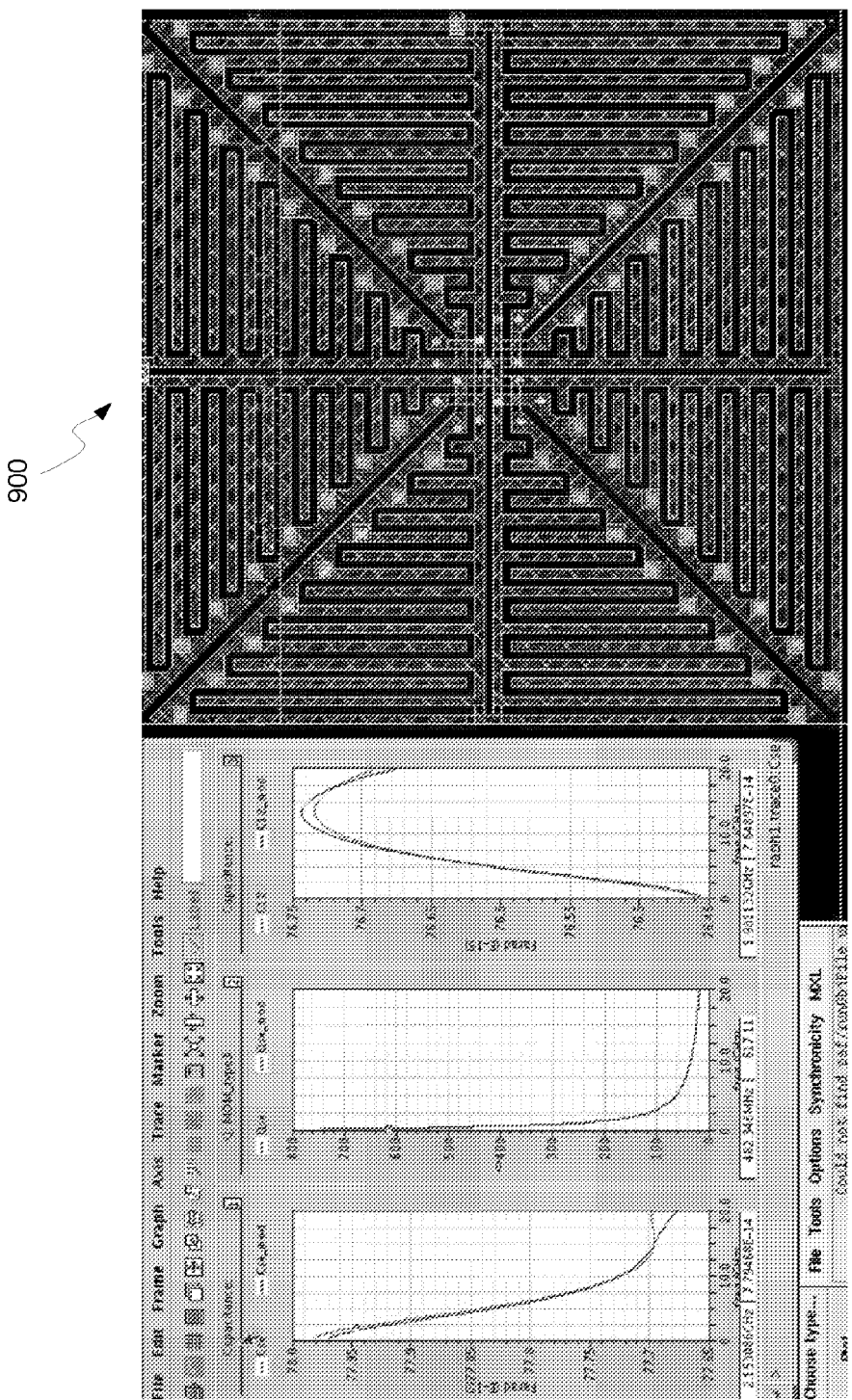
FIG. 9 is a diagram illustrating electrical measurements and simulations of radially symmetric on-chip capacitors, in accordance with an embodiment of the invention.

FIG. 9 is a diagram illustrating electrical measurements and simulations of radially symmetric on-chip capacitors, in accordance with an embodiment of the invention. Referring to FIG. 9, there is shown measured and simulated capacitance and Q-value of the on-chip capacitor 900 shown on the right in FIG. 9. The results show good agreement between simulated and measured capacitance.

In an embodiment of the invention, a method and system may comprise a semiconductor die comprising an on-chip capacitor 200, 300, 310, 400, 500 comprising one or more metal layers 221, 223, 225, 405, 407, 505, 507, 700, 800. The on-chip capacitor 200, 300, 310, 400, 500 may comprise a first set of electrically coupled metal fingers 201A, 201C, 801, 901 and a second set of electrically coupled metal fingers 201B, 201D, 803, 903 that are interdigitated with the first electrically coupled set of metal fingers. The first set of electrically coupled metal fingers 201A, 201C, 801, 901 and the second set of electrically coupled metal fingers 201B, 201D, 803, 903 may be arranged symmetrically in the semiconductor die 250 to compensate for non-uniformities in the one or more metal layers 221, 223, 225, 405, 407, 505, 507, 700, 800. The electrically coupled first set of metal fingers 201A, 201C, 701, 801 and the electrically coupled second set of metal fingers 201B, 201D, 703, 803 may be arranged with radial symmetry. A first set of metal fingers 701, 703 in a first metal layer 700 may be electrically coupled to a set of metal fingers 801, 803 in a second metal layer 800.

An orientation and interconnection location of metal fingers may be alternated when coupling sets of metal fingers 201A, 201B, 201C, 201D, 701, 703, 801, and 803 in a plurality of metal layers 221, 223, 225, 405, 407, 505, 507, 700, 800. The orientation of the metal fingers 201A, 201B, 201C, 201D, 801, 803, 901, and 903 may be alternated between clockwise and counter-clockwise directions. The first set of metal fingers 701 may be coupled at the center of the on-chip capacitor 200, 300, 310, 400, 500 and the second set of metal fingers 703 may be coupled at the outer edge of the on-chip capacitor. The first set of metal fingers 801 may be coupled at the outer edge of the on-chip capacitor 200, 300, 310, 400, 500 and the second set of metal fingers 803 may be coupled at the center of the on-chip capacitor. The electrically coupled first set of metal fingers and the electrically coupled second set of metal fingers may be configured in a fan-like orientation. The on-chip capacitor 200, 300, 310, 400, 500 may be configured in a plurality of symmetric sections a-h wherein a boundary between each of the plurality of sections a-h is configured in a zig-zag pattern.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for improved matching of on-chip capacitors.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:
1. A semiconductor device comprising:
a semiconductor die comprising an on-chip capacitor, said on-chip capacitor comprising:
a first set of electrically coupled metal fingers; and a second set of electrically coupled metal fingers that are interdigitated with the first set of electrically coupled metal fingers, wherein:
the first set of electrically coupled metal fingers and the second set of electrically coupled metal fingers are arranged symmetrically in the semiconductor die;
the on-chip capacitor is configured in a plurality of symmetric sections; and
the first set of electrically coupled metal fingers is only clockwise-oriented in each section of the on-chip capacitor and the second set of electrically coupled metal fingers is only counter-clockwise-oriented in each section of the on-chip capacitor.

2. The system according to claim 1, wherein the first set of electrically coupled metal fingers and the second set of electrically coupled metal fingers are arranged with radial symmetry.

3. The system according to claim 1, wherein a first set of metal fingers in a first metal layer are electrically coupled to a set of metal fingers in a second metal layer.

4. The system according to claim 1, wherein an orientation of metal fingers of the first and second sets of electrically coupled metal fingers is alternated when sets of metal fingers are coupled in a plurality of metal layers.

5. The system according to claim 4, wherein the orientation of the metal fingers of the first and second sets of electrically coupled metal fingers is alternated between clockwise and counter-clockwise directions.

6. The system according to claim 1, wherein the first set of electrically coupled metal fingers is coupled at the center of the on-chip capacitor and the second set of electrically coupled metal fingers is coupled at the outer edge of the on-chip capacitor.

7. The system according to claim 1, wherein the first set of metal fingers is coupled at the outer edge of the on-chip capacitor and the second set of metal fingers is coupled at the center of the on-chip capacitor.

8. The system according to claim 1, wherein the first set of electrically coupled metal fingers and the second set of electrically coupled metal fingers are configured in a fan-like orientation.

9. A semiconductor device comprising:
a semiconductor die comprising an on-chip capacitor, said on-chip capacitor comprising:
a first layer comprising a first set of electrically coupled metal fingers interdigitated with a second set of electrically coupled metal fingers, wherein the first set of electrically coupled metal fingers and the second set of electrically coupled metal fingers are arranged symmetrically in the first semiconductor layer; and
a second layer comprising a third set of electrically coupled metal fingers interdigitated with a fourth set of electrically coupled metal fingers, wherein the third set of electrically coupled metal fingers and the fourth set of electrically coupled metal fingers are arranged symmetrically in the second semiconductor layer, the first and third set of electrically coupled metal fingers are symmetric with respect to the first and second layers, wherein:
the on-chip capacitor is configured in a plurality of symmetric sections; and
the first and third sets of electrically coupled metal fingers are only clockwise-oriented throughout the on-chip capacitor and the second and fourth sets of electrically coupled metal fingers are only counter-clockwise-oriented throughout the on-chip capacitor.

10. The semiconductor die according to claim 9, wherein the first set of electrically coupled metal fingers and the second set of electrically coupled metal fingers are arranged with radial symmetry.

11. The semiconductor die according to claim 9, wherein the third set of electrically coupled metal fingers and the fourth set of electrically coupled metal fingers are arranged with radial symmetry.

12. The semiconductor die according to claim 9, wherein the first set of electrically coupled metal fingers are electrically coupled to the third set of electrically coupled metal fingers.

13. The semiconductor die according to claim 9, wherein the second set of electrically coupled metal fingers are electrically coupled to the fourth set of electrically coupled metal fingers.

14. The semiconductor die according to claim 9, wherein the first set of electrically coupled metal fingers are electrically coupled to the fourth set of electrically coupled metal fingers.

15. The semiconductor die according to claim 9, wherein the second set of electrically coupled metal fingers are electrically coupled to the third set of electrically coupled metal fingers.

16. The semiconductor die according to claim 9, wherein an orientation of metal fingers of the first and second sets of electrically coupled metal fingers is alternated in a plurality of metal layers.

17. The semiconductor die according to claim 9, wherein the orientation of the metal fingers of the first and second sets of electrically coupled metal fingers is alternated between clockwise and counter-clockwise directions.

18. The semiconductor die according to claim 9, wherein the first set of electrically coupled metal fingers is coupled at the center of the on-chip capacitor and the second set of electrically coupled metal fingers is coupled at the outer edge of the on-chip capacitor.

19. The semiconductor die according to claim 9, wherein the third set of electrically coupled metal fingers is coupled at the center of the on-chip capacitor and the fourth set of electrically coupled metal fingers is coupled at the outer edge of the on-chip capacitor.

20. The semiconductor die according to claim 9, wherein the first set of electrically coupled metal fingers and the second set of electrically coupled metal fingers are configured in a fan-like orientation.

21. A semiconductor device comprising:
a complementary metal-oxide semiconductor (CMOS) die comprising an on-chip capacitor and switches that are operable to configure the on-chip capacitor, said on-chip capacitor comprising:
one or more metal layers; and
first and second sets of electrically coupled interdigitated metal fingers that are arranged symmetrically in the semiconductor die, wherein the on-chip capacitor is configured in a plurality of symmetric sections and the first set of electrically coupled fingers is only clockwise-oriented in each section of the on-chip capacitor and the second set of electrically coupled metal fingers is only counter-clockwise-oriented in each section of the on-chip capacitor.

* * * * *